US007000214B2

(12) United States Patent
Iadanza et al.

(10) Patent No.: US 7,000,214 B2
(45) Date of Patent: Feb. 14, 2006

(54) METHOD FOR DESIGNING AN INTEGRATED CIRCUIT HAVING MULTIPLE VOLTAGE DOMAINS

(75) Inventors: Joseph A. Iadanza, Hinesburg, VT (US); Raminderpal Singh, Essex Junction, VT (US); Sebastian T. Ventrone, South Burlington, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 10/707,068

(22) Filed: Nov. 19, 2003

(65) Prior Publication Data

US 2005/0108667 A1    May 19, 2005

(51) Int. Cl.
*G06F 17/50* (2006.01)
(52) U.S. Cl. .......................................... 716/18; 703/18
(58) Field of Classification Search ................. 716/18; 703/18
See application file for complete search history.

(56) References Cited

U.S. PATENT DOCUMENTS 6,577,992 B1 *   6/2003   Deng et al. .................... 703/14
6,792,582 B1 *   9/2004   Cohn et al. ..................... 716/7
6,823,293 B1 *  11/2004   Chen et al. .................. 702/191
2001/0017568 A1 *  8/2001   Kasa et al. ................... 327/565
2004/0133860 A1 *  7/2004   Hieter et al. ................... 716/2
2004/0172603 A1 *  9/2004   Collmeyer et al. ............. 716/1
2005/0010887 A1 *  1/2005   Bednar et al. .................. 716/8
2005/0065765 A1 *  3/2005   Visweswariah ............... 703/19

* cited by examiner

*Primary Examiner*—Vuthe Siek
*Assistant Examiner*—Naum B. Levin
(74) *Attorney, Agent, or Firm*—Schmeiser, Olsen & Watts; Anthony Canale

(57) ABSTRACT

A method for designing an integrated circuit having multiple voltage domains, including: (a) generating a logical integrated circuit design from information contained in a high-level design file, the high-level design file defining global connection declarations and voltage domain connection declarations; (b) synthesizing the logical integrated circuit design into a synthesized integrated circuit design based upon the logical integrated circuit design, information in a preferred components file and information in a voltage domain definition file; (c) generating a noise model from the synthesized integrated circuit design based on information in the voltage domain definition file and a design constraint file; and (d) simulating the noise model against constraints in the design constraint file and constraints in a circuit level profile file to determine if the synthesized integrated circuit design meets predetermined noise simulation targets.

20 Claims, 9 Drawing Sheets

VOLTAGE DOMAIN DEFINITION FILE 205

| CONNECTION DECLARATION | GLOBAL | VOLTAGE ISLAND | FLATTEN LEVEL | OFF CHIP SUPPLY | REGULATED SUPPLY | SUPPLY HEADER | CONTROLLED FROM | GND NOISE ISOLATED | VSS RAIL VALUE (V) | VDD RAIL VALUE (V) | EXTERNAL NOISE SUPPRESSION REQUIRED |
|---|---|---|---|---|---|---|---|---|---|---|---|
| WIRE | Y | | | Y | | | | | 0.0 | 1.2 | |
| REGISTER | Y | | | Y | | | | | 0.0 | 1.2 | |
| INPUT | Y | | | Y | | | | | 0.0 | 1.2 | |
| OUTPUT | Y | | | Y | | | | | 0.0 | 1.2 | |
| WIREVDD2 | Y | | | Y | | | | | 0.0 | 2.5 | |
| INPUTVDD2 | Y | | | Y | | | | | 0.0 | 2.5 | |
| OUTPUTVDD2 | Y | | | Y | | | | | 0.0 | 2.5 | |
| WIRE H1 VIA | | Y | | | Y | | WIRE VDD2 | | -0.5 | 1.5 | Y |
| REGISTER H1 VIA | | Y | | | Y | | WIRE VDD2 | | -0.5 | 1.5 | Y |
| INPUT H1 VIA | | Y | | | Y | | WIRE VDD2 | | -0.5 | 1.5 | Y |
| OUTPUT H1 VIA | | Y | | | | | WIRE VDD2 | | -0.5 | 1.5 | |
| WIRE H1 VIB | | Y | | | | Y | WIRE | | 0.0 | 1.2 | |
| REGISTER H1 VIB | | Y | | | | Y | WIRE | | 0.0 | 1.2 | |
| INPUT H1 VIB | | Y | | | | Y | WIRE | | 0.0 | 1.2 | |
| OUTPUT H1 VIB | | Y | | | | Y | WIRE | | 0.0 | 1.2 | |
| WIRE H1 VIC | | Y | | Y | | | | Y | 0.0 | 1.2 | |
| REGISTER H1 VIC | | Y | | Y | | | | Y | 0.0 | 1.2 | |
| INPUT H1 VIC | | Y | | Y | | | | Y | 0.0 | 1.2 | |
| OUTPUT H1 VIC | | Y | | Y | | | | Y | 0.0 | 1.2 | |
| WIRE H1 VID | | Y | | Y | | | | | 0.0 | 1.75 | Y |
| REGISTER H1 VID | | Y | | Y | | | | | 0.0 | 1.75 | Y |
| INPUT H1 VID | | Y | | Y | | | | | 0.0 | 1.75 | Y |
| OUTPUT H1 VID | | Y | | Y | | | | | 0.0 | 1.75 | Y |
| WIRE H1 VIE | | Y | WIRE H1 VC | | | | | | | | |
| REGISTER H1 VIE | | Y | REGISTER H1 VC | | | | | | | | |
| INPUT H1 VIE | | Y | INPUT H1 VC | | | | | | | | |
| OUTPUT H1 VIE | | Y | OUTPUT H1 VC | | | | | | | | |

*FIG. 4*

| DESIGN CONSTRAINT FILE 210 | | | | | | | |
|---|---|---|---|---|---|---|---|
| CONNECTION DECLARATION | VDD NOISE TARGET (mV) | VSS NOISE TARGET (mV) | VDD DROOP TARGET (mV) | VSS DROOP TARGET (mV) | OPERATING FREQUENCY (MHz) | SWITCHING FACTOR % | CLOCK CYCLE OFFSET (%) |
| WIRE REGISTER INPUT OUTPUT | 300 300 300 300 | 200 200 200 200 | 100 100 100 100 | 100 100 100 100 | 80 80 80 80 | 50 50 50 50 | 0 0 0 0 |
| WIREVDD2 INPUTVDD2 OUTPUTVDD2 | 400 400 400 | 300 300 300 | 200 200 200 | 200 200 200 | 40 40 40 | 50 50 50 | 50 50 50 |
| WIRE H1 VIA REGISTER H1 VIA INPUT H1 VIA OUTPUT H1 VIA | 100 100 100 100 | 50 50 50 50 | 100 100 100 100 | 100 100 100 100 | 160 160 160 160 | 50 50 50 50 | 0 0 0 0 |
| WIRE H1 VIB REGISTER H1 VIB INPUT H1 VIB OUTPUT H1 VIB | 100 100 100 100 | 100 100 100 100 | 200 200 200 200 | 200 200 200 200 | 20 20 20 20 | 30 30 30 30 | 50 50 50 50 |
| WIRE H1 VIC REGISTER H1 VIC INPUT H1 VIC OUTPUT H1 VIC | 100 100 100 100 | 100 100 100 100 | 50 50 50 50 | 50 50 50 50 | 200 200 200 200 | 50 50 50 50 | 0 0 0 0 |
| WIRE H1 VID REGISTER H1 VID INPUT H1 VID OUTPUT H1 VID | 100 100 100 100 | 50 50 50 50 | 25 25 25 25 | 25 25 25 25 | 200 200 200 200 | 50 50 50 50 | 0 0 0 0 |

*FIG. 5*

PREFERRED COMPONENTS FILE 215

SPECIFIC COMPONETS WITHIN
THE SYSTEM LIBRARAY TO
TARGET FOR USE IN DESIGN

**ON-CHIP CAPACITORS
    CAP1
    CAP3
**OFF-CHIP CAPACITORS
    DCACAP1
**ON MODULE CAPACITORS
    *NULL ENTRY

**ON CHIP REGULATORS
    REG1
**OFF CHIP REGULATORS
    *NULL ENTRY
**HEADERS
    VDDHEADER1
    VDDHEADER4
    VSSHEADER1
*NOISE FILTERS
    NOISEFILTER1
*OFF-CHIP FILTERS
    DCAFFRRITE1

**RESISTORS
    RES3
    RES 8
**DCA RESISTORS
    NULL ENTRY
**MODULE LEVEL RESISITORS
    MODRES1

*FIG. 6*

METHOD FOR DESIGNING AN INTEGRATED CIRCUIT HAVING MULTIPLE VOLTAGE DOMAINS

BACKGROUND OF INVENTION

1. Field of the Invention

The present invention relates to the field of integrated circuits; more specifically, it relates to a system and method for designing an integrated circuit having multiple voltage domains.

2. Background of the Invention

As integrated circuits have increased in complexity, voltages on power distribution networks have been reduced in order to reduce power consumption. However, these voltage reductions can have an adverse impact on the AC performance and noise immunity of integrated circuits. The use of voltage partitioning of an integrated circuit (IC) chip into voltage domains or islands allows some portions of an IC to operate at higher voltages for improved AC performance and noise immunity and other portions of the same IC to operate at a lower voltage for reduced power consumption.

However, even with modern design systems, designing such integrated circuits is a very labor-intensive process. Therefore, there is a need for an automated design system for designing an IC having multiple voltage domains.

SUMMARY OF INVENTION

A first aspect of the present invention is a method for designing an integrated circuit having multiple voltage domains, comprising: (a) generating a logical integrated circuit design from information contained in a high-level design file, the high-level design file defining global connection declarations and voltage domain connection declarations; (b) synthesizing the logical integrated circuit design into a synthesized integrated circuit design based upon the logical integrated circuit design, information in a voltage domain definition file and a design constraint file; (c) generating a noise model from the synthesized integrated circuit design based on information in the voltage domain definition file, a circuit level profile and a design constraint file; and (d) simulating the noise model against constraints in the design constraint file and constraints in a circuit level profile file to determine if the synthesized integrated circuit design meets predetermined noise targets.

A second aspect of the present invention is a computer system comprising a processor, an address/data bus coupled to the processor, and a computer-readable memory unit adapted to be coupled to the processor, the memory unit containing instructions that when executed by the processor implement a method for designing an integrated circuit having multiple voltage domains, the method comprising the computer implemented steps of: (a) generating a logical integrated circuit design from information contained in a high-level design file, the high-level design file defining global connection declarations and voltage domain connection declarations; (b) synthesizing the logical integrated circuit design into a synthesized integrated circuit design based upon the logical integrated circuit design, information in a voltage domain definition file and a design constraint file; (c) generating a noise model from the synthesized integrated circuit design based on information in the voltage domain definition file, a circuit level profile file and optionally, a design constraint file; and (d) simulating the noise model against constraints in the design constraint file and constraints in a circuit level profile file to determine if the synthesized integrated circuit design meets predetermined noise targets.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 4 is a diagram illustrating an exemplary voltage domain definition file according to the present invention;

FIG. 5 is a diagram illustrating an exemplary design constraint file according to the present invention;

FIG. 6 is a diagram illustrating an exemplary preferred components file according to the present invention;

DETAILED DESCRIPTION

For the purposes of the present invention the terms voltage domain and voltage island are used interchangeably to denote the same entity, namely a bounded region of an IC chip having an internal power distribution network that is supplied from a power source external to that region. The term "designer" when used to describe the present invention refers to intervention by a human circuit designer. The terms "synthesizer," "noise modeler," "simulator," "analyzer," and "physical design tool" refer to software programs.

Figure 1:
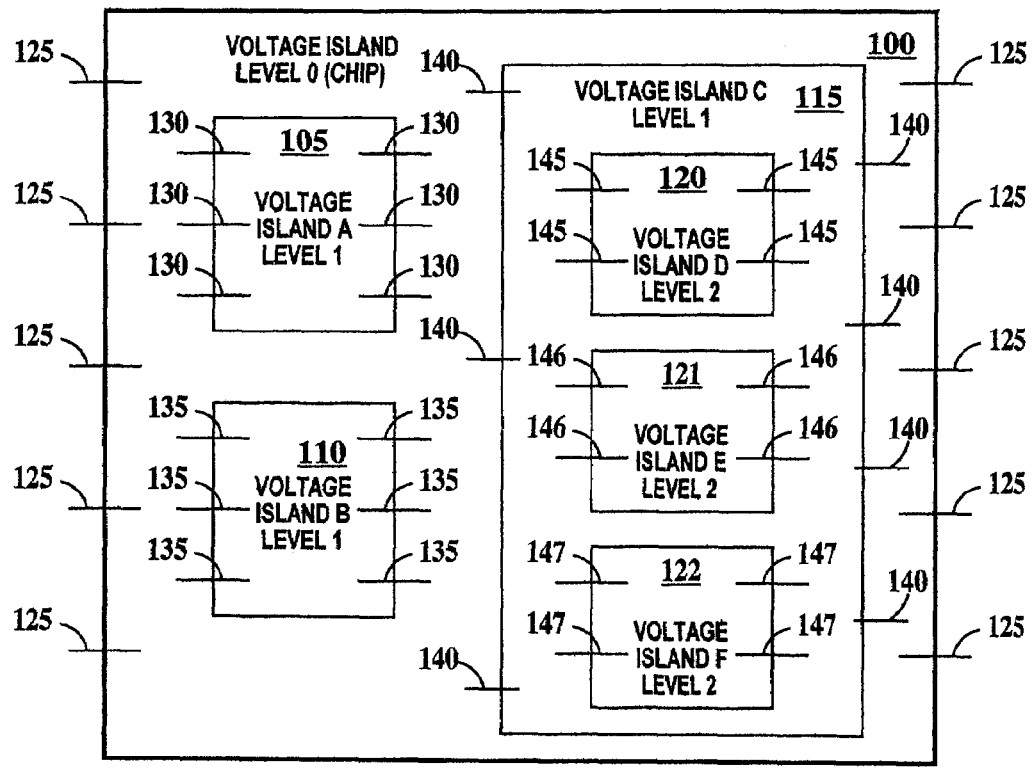
FIG. 1 is a diagram illustrating the partitioning of an exemplary IC into voltage islands according to the present invention.

FIG. 1 is a diagram illustrating the partitioning of an exemplary IC 100 into voltage islands according to the present invention. In FIG. 1, IC chip 100 includes voltage island A 105, voltage island B 110 and voltage island C 115. IC chip 100 may be considered a voltage island itself. Voltage island C 115 further includes nested voltage island D 120, voltage island E 121 and voltage island F 122. As many levels of nesting of voltage islands as a particular IC design calls for may be incorporated into IC chip 100. Thus, voltage islands are hierarchical in nature. By convention, the higher a voltage island level or hierarchy, the more deeply it may be nested. In the example of FIG. 1, there are three levels, 0, 1 and 2, with the highest (level 2) being the most deeply nested. Communication and power are supplied to IC chip 100 by a multiplicity of signal and power connections 125. Communication and power are supplied to voltage island A 105 by a multiplicity of signal and power connections 130. Signal and power connections 130 may be connected to signal sources and power networks within IC chip 100 or from off chip or both. Communication and power are supplied to voltage island 110B by a multiplicity of signal and power connections 135. Signal and power connections 135 may be connected to signal sources and power networks within IC chip 100 or from off-chip or both. Communication and power are supplied to voltage island C 115 by a multiplicity of signal and power connections 140. Signal and power connections 140 may be connected to signal sources and power networks within IC chip 100 or from off-chip or both. Communication and power are supplied to voltage island D 120, voltage island E 121 and voltage island F 122 by a multiplicity of signal and power connections 145, 146 and 147 respectively. Signal and power connections 145, 146 and 147 may be independently connected to signal sources and power networks within voltage island 115, within IC chip 100, from off-chip or combinations thereof.

Figure 2:
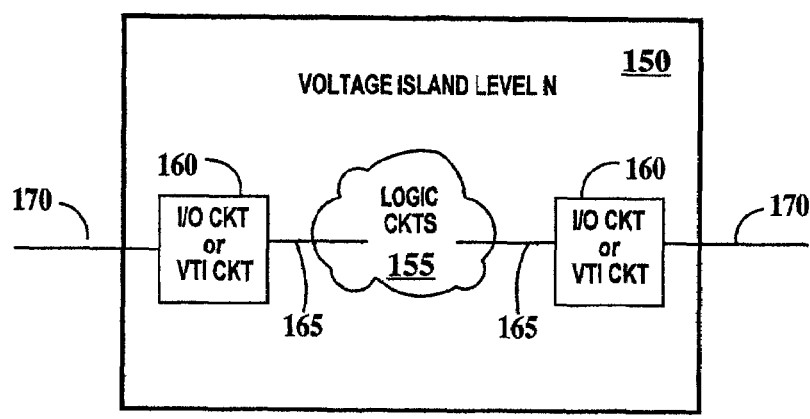
FIG. 2 is a diagram illustrating the boundary between exemplary voltage islands according to the present invention.

FIG. 2 is a diagram illustrating the boundary between exemplary voltage islands according to the present invention. In FIG. 2, a voltage island 150 includes a group of digital, analog, or mixed signal circuits 155 connected to boundary circuits 160 by connections 165. Boundary circuits 160 are connected to the next lower voltage island level by connections 170. Boundary circuits, which may include I/O circuits and voltage translation interface (VTI) circuits are employed as necessary to make the transition between voltage domains and may provide voltage level shifting to accommodate differences in supply rail voltages. Such circuits may also be designed to handle stabilization of voltage domain inputs and outputs during domain power-up and power-down events. Connections 165 and 170 are distinguished from each other in the present invention, connection 165 being defined using a voltage island connection declaration associated with voltage island level N and connection 170 being defined using a voltage island connection declaration associated with island level N-1. Connection declarations are widely known in the art as part of high-level logic description languages such as Verilog and very high-speed hardware description language (VHDL) and are used to impart properties on logic inferred or instantiated within the high-level design. For example, within Verilog, connection declaration WIRE is used to describe inferred combinational functions or pass-through connections to instantiations; REGISTER is used to describe inferred sequential or clocked functions; and INPUT and OUTPUT are used to describe the input and output ports of the defined function. Connection declarations are extended to further define voltage island content and connectivity beyond logic/signal connectivity known in the art. For the purposes of the present invention, signal declarations with similar extensions define a common voltage domain for all logic inferred or instantiated using the signal declarations, while differences in signal declaration extensions between groups of logic, instantiated logic or hierarchies define voltage domain boundaries.

The present invention utilizes four unique design files for automating the design of an IC having voltage islands. Each is illustrated and described infra.

Figure 3:
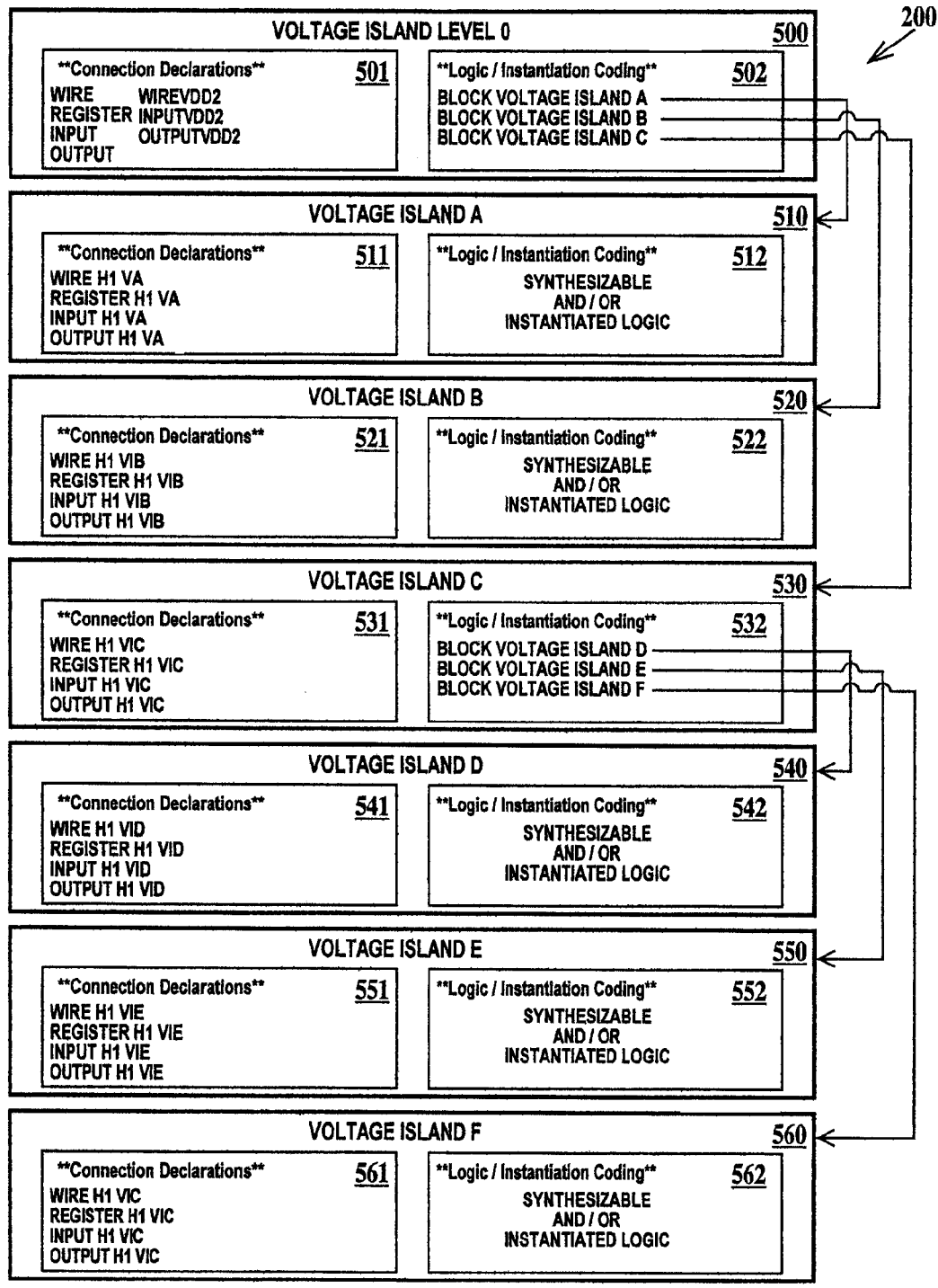
FIG. 3 is a diagram illustrating an exemplary technology-independent high-level design file according to the present invention.

FIG. 3 is diagram illustrating an exemplary technology-independent high-level design file 200 according to the present invention. High-level design file 200 may be used to generate exemplary IC chip 100 of FIG. 1. FIG. 3 illustrates examples of some of the information contained in high-level design file 200 and other information may be present. For the purposes of describing the invention, high-level design file 200 is illustrated using a Verilog high-level language format; however, one skilled in the art would understand that the invention may be applied similarly to other high-level languages. High-level design file 200 is similar to a standard hierarchical high-level design file with the exception that it contains extensions of standard connection declarations (WIRE, REGISTER, INPUT and OUTPUT), with each connection declaration variant being used to infer voltage island content and boundaries in addition to its known use in defining the properties of logical content.

Within high-level design file 200, a block 500 describes voltage island level 0 of exemplary IC chip 100 illustrated in FIG. 1 and described supra. Block 500 includes a connection declaration section 501 and a logic/instantiation coding section 502. The connection declarations WIRE, REGISTER, INPUT, OUTPUT, WIREVDD2, INPUTVDD2 and OUTPUTVDD2 within connection declaration section 501, define the logical properties of signals and logic functions contained within block 500. Logic/instantiation coding section 502 contains the logic description for the immediately next deeper level of the hierarchy of voltage islands which includes the three hierarchical instantiations: voltage island A, voltage island B and voltage island C, each of which are at voltage island hierarchical level 1 of high-level design file 200.

Block 510 includes a connection declaration section 511 and a logic/instantiation coding section 512 for voltage island A of logic/instantiation coding 502. The connection declarations WIRE_H1_VIA, REGISTER_H1_VIA, INPUT_H1_VIA and OUTPUT_H1_VIA within connection declaration section 511, define the logical properties of signals and logic functions contained within block 510 and uniquely differentiate the function of block 510 from other portions of high-level design file 200. Logic/instantiation coding section 512 defines the functions of voltage island A. The logic functions of logic/instantiation coding section 512 may be coded in many different ways to facilitate logic synthesis, may contain unique instantiations of hierarchical functions, devices or black boxes, or may contain a combination of coding styles. Instantiated functions need not share connection declaration types with lower levels of hierarchy as will be explained infra.

Block 520 includes a connection declaration section 521 and a logic/instantiation coding section 522 for voltage island B of logic/instantiation coding 502. The connection declarations WIRE_H1_VIB, REGISTER_H1_VIB, INPUT_H1_VIB and OUTPUT_H1_VIB within connection declaration section 521, define the logical properties of signals and logic functions contained within block 520 and uniquely differentiate the function of block 520 from other portions of high-level design file 200. Logic/instantiation coding section 522 defines the functions of voltage island B. The logic functions of logic/instantiation coding section 522 may be coded in many different ways to facilitate logic synthesis, may contain unique instantiations of hierarchical functions, devices or black boxes, or may contain a combination of coding styles. Instantiated functions need not share connection declaration types with lower levels of hierarchy as will be explained infra.

Block 530 includes a connection declaration section 531 and a logic/instantiation coding section 532 for voltage island C of logic/instantiation coding 502. The connection declarations WIRE_H1_VIC, REGISTER_H1_VIC, INPUT_H1_VIC and OUTPUT_H1_VIC within connection declaration section 531, define the logical properties of signals and logic functions contained within block 530 and uniquely differentiates the function of block 530 from other portions of high-level design file 200. Logic/instantiation coding section 532 defines the functions of voltage island C. The logic functions of logic/instantiation coding section 532 may be coded in many different ways to facilitate logic synthesis, may contain unique instantiations of hierarchical functions, devices or black boxes, or may contain a combination of coding styles. Instantiated functions need not share connection declaration types with lower hierarchies as will be explained infra. Logic/instantiation coding section 532 also contains the logic description for the immediately next deeper level of the hierarchy of voltage islands which includes the three hierarchical instantiations: voltage island D, voltage island E and voltage island F, each of which are at voltage island hierarchical level 2 of high-level design file 200.

Block 540 includes a connection declaration section 541 and a logic/instantiation coding section 542 for voltage island D of logic/instantiation coding 542. The connection declarations WIRE_H1_VID, REGISTER_H1_VID, INPUT_H1_VID and OUTPUT_H1_VID within connection declaration section 541, define the logical properties of signals and logic functions contained within block 540 and uniquely differentiates the function of block 540 from other portions of high-level design file 200. Logic/instantiation coding section 542 defines the functions of voltage island D. The logic functions of logic/instantiation coding section 542 may be coded in many different ways to facilitate logic synthesis, may contain unique instantiations of hierarchical functions, devices or black boxes, or may contain a combination of coding styles. Instantiated functions need not share connection declaration types with lower levels of hierarchy as will be explained infra.

Block 550 includes a connection declaration section 551 and a logic/instantiation coding section 552 for voltage island E of logic/instantiation coding 552. The connection declarations WIRE_H1_VIE, REGISTER_H1_VIE, INPUT—H1_VIE and OUTPUT_H1_VIE within connection declaration section 551, define the logical properties of signals and logic functions contained within block 550 and uniquely differentiate the function of block 550 from other portions of high-level design file 200. Logic/instantiation coding section 552 defines the functions of voltage island E. The logic functions of logic/instantiation coding section 552 may be coded in many different ways to facilitate logic synthesis, may contain unique instantiations of hierarchical functions, devices or black boxes, or may contain a combination of coding styles. Instantiated functions need not share connection declaration types with lower levels of hierarchy as will be explained infra.

Block 560 includes a connection declaration section 561 and a logic/instantiation coding section 562 for voltage island F of logic/instantiation coding 562. The connection declarations WIRE_H1_V1C, REGISTER_H1_V1C, INPUT_H1_V1C and OUTPUT_H1_V1C within connection declaration section 561 are identical to the connection declarations of block 530; the next-lower hierarchy of the IC. Connection declarations in section 561 are used to define the logical properties of signals and logic functions contained within block 560 and associate the function of block 560 with the hierarchy 1 voltage domain defined in block 560. The logic functions of logic/instantiation coding section 562 may be coded in many different ways to facilitate logic synthesis, may contain unique instantiations of hierarchical functions, devices or black boxes, or be a combination of coding styles. Instantiated functions need not share connection declaration types with lower levels of hierarchy as will be explained infra.

FIG. 4 is diagram illustrating an exemplary voltage domain definition file 205 according to the present invention. FIG. 4 illustrates examples of some of the attributes of a voltage domain in voltage domain definition file 205 used in generating IC chip 100 (FIG. 1) from high-level design file 200 (FIG. 3) and other information may be present. Voltage domain definition file 205 contains both technology-independent attributes related to voltage domains desired within high-level design file 200 and technology-dependent information such as VDD and VSS rail voltage levels and isolation techniques to be used which may vary from one target technology to another. Voltage domain definition file 205 associates each signal declaration with a set of voltage domain characteristics or attributes which the signal declarations infer. Attributes may include whether the inferred voltage domain is global, voltage island specific or targeted for flattening into a lower voltage island level of hierarchy identified in file 205. Other attributes include the source of the inferred voltage domain, which may be from off-chip or from an internal power bus, whether the voltage domain's supply is to be regulated, gated or otherwise controlled along with the power or voltage domain source for these functions, whether the voltage domain is to be ground noise isolated or requires externally mounted noise suppression devices, VSS (ground) rail value and VDD (power source voltage) rail value. All connection declaration definitions used in high-level design file 200 of FIG. 3 need not appear in voltage domain definition file 205. Only connection declarations intended to infer voltage domain information need be defined and generation of IC chip 100 (FIG. 1) from a combination of connection declarations defined in file 205 and undefined connection declarations as a function of their hierarchy is described infra.

FIG. 5 is a diagram illustrating an exemplary design constraint file 210 according to the present invention. FIG. 5 illustrates examples of some of the information in design constraint file 210 used in generating IC chip 100 (FIG. 1) from high-level design file 200 (FIG. 2) and other information may be present. Design constraints file 210 contains both technology-independent information related to voltage domains desired within high-level design file 200 and technology-dependent information such as allowable VDD and VSS rail noise levels and static voltage drop targets which may vary from one target technology to another. Design constraint file 210 includes for each connection declaration type (which infers a unique voltage domain as defined by voltage domain definition file 205) a static current-resistance (IR) drop and transient noise limit targets for both the VDD and VSS rails present in the inferred domain. Additionally, design constraint file 210 contains information defining the operational clock frequency present within the inferred voltage domain used in generating simulatable models for each voltage domain. Design constraint file 210 may also include a designer-entered switching factor and a start-of-switch offset factor used in generating simulatable models for each voltage domain as described infra.

FIG. 6 is a diagram illustrating an exemplary preferred components file 215 according to the present invention. FIG. 6 illustrates examples of some of the information in preferred components file 215 used in generating IC chip 100 (see FIG. 1) from high-level design file 200 (see FIG. 3) and other information may be present. Preferred components file 215 contains technology-dependent information defining a subset of components to use, from a larger set of components available within a technology-specific synthesis library, in generating voltage domains in accordance with high-level design file 200 (see FIG. 3), voltage domain definition file 205 (see FIG. 4) and design constraints file 210 (see FIG. 5). Optional preferred components file 215 may include a list of various power supply elements such as regulators, voltage translators, on-chip capacitors, direct-chip-attach noise filters and on-package components such as resistors, capacitors, inductors, ferrites, voltage regulators as well as other known components or combinations thereof acceptable for incorporation into IC chip 100 of FIG. 1. Preferred components file 215 limits design synthesis (illustrated in FIG. 7A and described infra) to voltage domain related design elements defined by the designer as a subset of a larger available library. Should optional preferred components file 215 not be present, any voltage domain related components available within the larger technology-dependent synthesis library may be used.

The high-level design of IC chip 100 of FIG. 1 is generated from the elements in high-level design file 200 (see FIG. 3), which includes connection declarations used in defining functions at various levels of hierarchy of the IC design inferred voltage domain contents and boundaries in addition to the desired functional descriptions and device instantiations. Voltage domain definition file 205 (see FIG. 4), design constraint file 210 (see FIG. 5) and optionally, preferred components file 215 (see FIG. 6) provide further details needed to incorporate voltage islands into the next level of design.

Figure 7A:
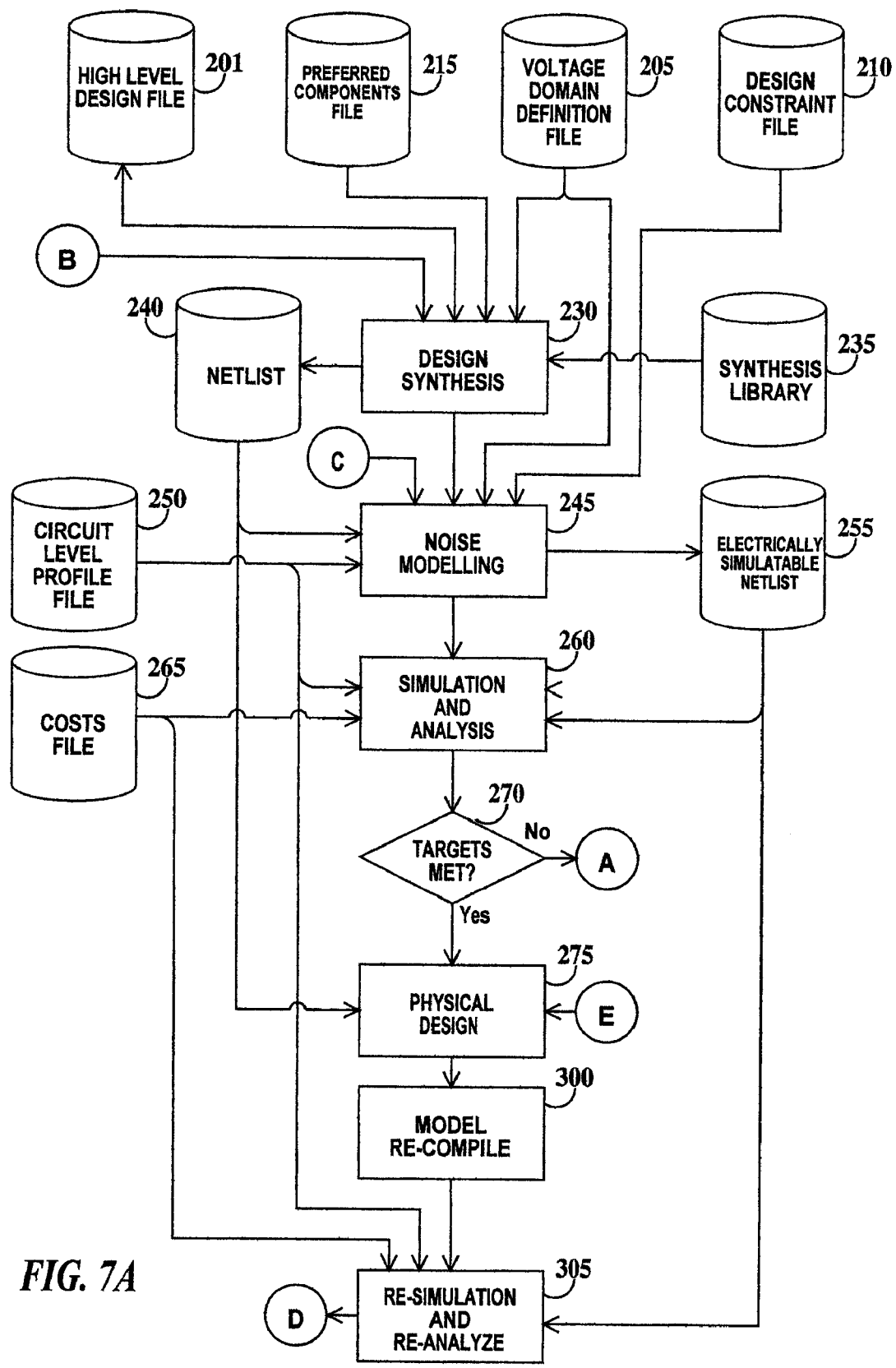
FIGS. 7A, 7B and 7C are a flowchart of the method for designing an IC having power distribution partitions according to the present invention.
Figure 7B:
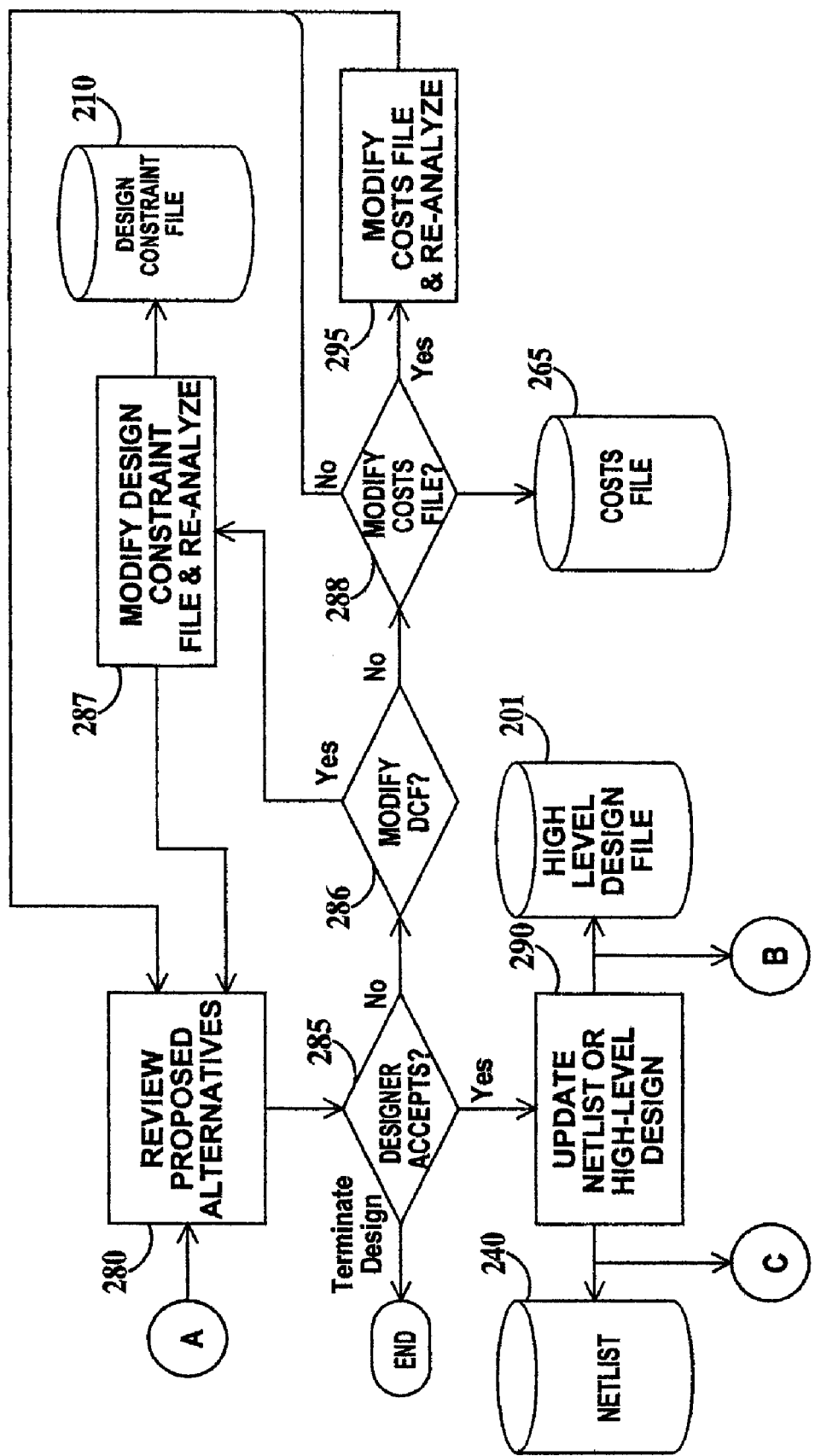
Figure 7C:
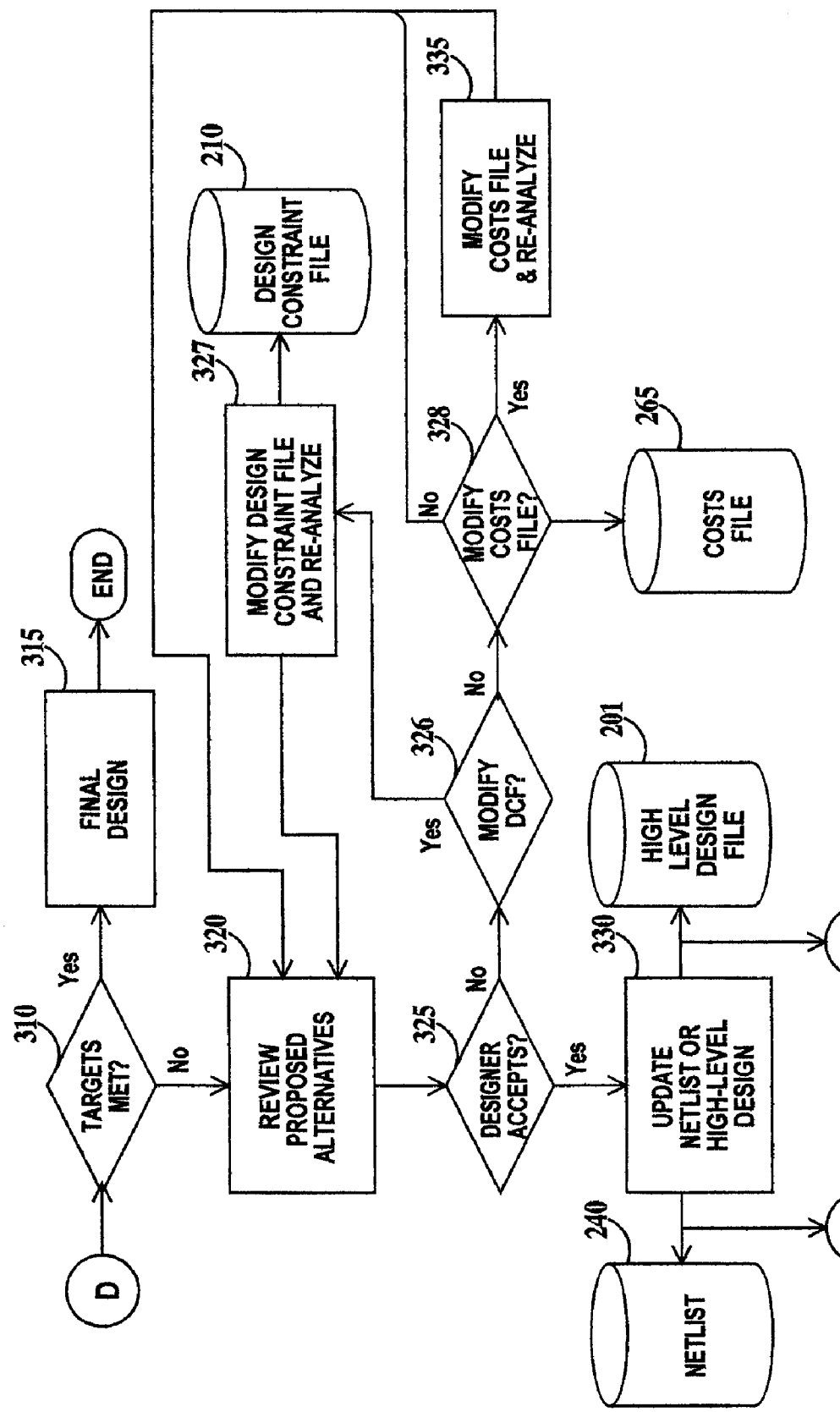

FIGS. 7A, 7B and 7C are a flowchart of the method for designing an IC having power distribution partitions according to the present invention. In FIG. 7A, steps between connectors "A", "B" and "C" are illustrated in FIG. 7B and steps between connectors "B", "D" and "E" are illustrated in FIG. 7C.

In step 230 design synthesis is performed. Design synthesis uses a high-level design file 201 which includes original and updated high-level designs of an IC chip (high-level design file 200 of FIG. 3 is an example), voltage domain definition file 205, technology-dependent synthesis library 235 and, if supplied, preferred components file 215 to generate a synthesized IC design netlist 240. Synthesis library 235 contains logic representations, timing data and physical size information for all devices and circuits available in a technology and may also include information on chip-level effects such as estimation of circuit-to-circuit connection lengths, parasitic estimation of connections and effects on circuit timing. The product of synthesis is a netlist, 240, which is a technology-dependent description of an IC design. Netlist 240 contains constituent logic gates, storage elements and analog components as well as the electrical connectivity description for IC chip 100 (FIG. 1). Netlist 240 is functionally equivalent to the technology-independent high-level design file 201.

Synthesis of a high-level design is performed sequentially from the deepest level of hierarchy (i.e. the highest level of voltage island) to the top level of IC chip 100 (see FIG. 1). During synthesis of each block within the design, the synthesizer parses the logic connection declarations and logic instantiation coding to determine if connection declarations with entries in the voltage domain definition file 205 are present. If voltage-domain-assigned connection declarations do not exist in the block or all connection declarations within the block are assigned "GLOBAL" status, the block is synthesized, generating combinational and sequential logic from inferred logic and instantiating directly specified devices and circuits. The resulting block level netlist is marked for inclusion the next lower level of hierarchy or voltage domain. If voltage-domain-assigned connection declarations do exist within the block, the block is synthesized, generating combinational and sequential logic from inferred logic and instantiating directly-specified devices and circuits, and as a final step in the synthesis process, VDD and VSS connections for the synthesized block are constructed in accordance with voltage domain definition file 205.

Step 230 includes unique naming of domain-specific rails, propagation of rail naming to all elements within the island, including higher levels of hierarchy marked for inclusion in a lower level of hierarchy by omission of connection declaration type inclusion in voltage domain definition file 205, specific instruction within voltage domain definition file 205 to equate the signal declarations in the higher hierarchy with those of the present hierarchy, or use of connection declarations declared as "GLOBAL". Additionally, the step includes synthesis and instantiation of circuits or devices such as regulator systems, capacitors, noise filters, headers and external bonding pins or pads and connection to the uniquely named VDD and VSS nets consistent with the voltage domain type defined in file 205, preferred components file 215, if it exists, and synthesis library 235.

Further, in step 230, synthesis operates on the input and output ports of the synthesized block to insert VTIs between logically bordering voltage domains. VTI selection is made in accordance with voltage domain definition file 205, preferred components file 215, if it exists, synthesis library 235, and connection declaration types for the next lower level of hierarchy in the high-level design. In addition to synthesis activity, which logically defines the voltage domain, step 230 includes insertion, within the netlist 240 of commands interpretable by down-stream tools which drive definition and generation of non-logical structures such as VSS isolation moats during subsequent physical design.

Synthesis from the highest level of hierarchy of high-level design to the lowest level is performed as described infra using high-level design file 200 of FIG. 3 as an example. Synthesis begins at the highest level of hierarchy, level 2, which includes blocks 540, 550 and 560 of FIG. 3.

Synthesis of block 540 results in a voltage-domain-level netlist and includes chip level connections for the domain VDD supply and VTI circuits appropriate for communication between circuits operating at VDD=1.2V and circuits operating at VDD=1.75V as defined in the voltage domain definition file 205. Additionally, connect pad references for external noise suppression devices, selected using preferred components file 215, if it exists, or synthesis library 235, are instantiated in accordance with voltage domain definition file 205.

During synthesis of block 550, (see FIG. 3) the synthesizer is instructed to redefine connection declarations within block 550 to those in block 530 (see FIG. 3), the next lower level of hierarchy, such that only logic synthesis is performed and the resulting netlist for block 550 (see FIG. 3) is marked for inclusion at hierarchy level 1 of the design. In a similar manner, block 560 (see FIG. 3), being defined using connection declarations also used at the next lower hierarchy undergoes logic synthesis only. Synthesis of block 530 (see FIG. 3) generates any inferred logic within 530 and integrates netlist portions for blocks 540, 550 and 560.

Synthesis of block 530 results in a voltage-domain-level netlist which includes unique naming references to the voltage domain VDD rail, chip level inputs for the local supply rails and VTIs consistent with voltage domain definition file 205 and appropriate for connecting to the various hierarchy level 0 signal declarations to which they attach. All logic generated within block 530 (see FIG. 3), as well as in blocks 550 (see FIG. 3) and 560 (see FIG. 3), which were marked for inclusion in the lower hierarchy, is assigned to the uniquely named VDD and VSS rails, effectively flattening function into the lower voltage domain hierarchy level.

The netlist generated for block 540, synthesized as a second level voltage domain, is merged into the netlist for block 530 without voltage rail re-assignment. Synthesis of block 510 (a first level voltage domain) results in a netlist block with all logic content using unique VDD and VSS rail names. The VDD rail local to block 510 is sourced from a regulator system producing a 1.5-volt VDD value. The regulator is sourced from the WIREVDD2 inferred domain. As VSS isolation is required in accordance with voltage domain definition file 205 due to a potential difference between global VSS and the local VSS voltage, a separate chip level pad for the local VSS is provided and netlist commands or attributes are inserted to drive physical design of the isolation. Input and output ports to block 510 (see FIG. 3) are synthesized to include VTIs appropriate to operate between voltage domains at level 0 and level 1 of the hierarchy.

Synthesis of block 520 (a first level voltage domain) results in a netlist block with all logic using a unique VDD rail name. The VDD rail local to block 520 is sourced from the WIRE inferred domain through a header circuit as defined in voltage domain definition file 205. Additionally, connect pad references for external noise suppression devices, selected using preferred components file 215, if it exists, or synthesis library 235, are instantiated in accordance with voltage domain definition file 205. Input and output ports to block 510 are synthesized to include VTIs appropriate to operate between voltage domains at level 0 and level 1 of the hierarchy.

Synthesis of block 500 of netlist 200 completes generation of the netlist for IC chip 100 (see FIG. 1). During synthesis, any logic inferred within block 500 (see FIG. 1) is generated. Should inferred logic exist for both WIRE/REGISTER/INPUT/OUTPUT and WIREVDD2/INPUTVDD2/OUTPUTVDD2 connection declarations, these logic sets would be separated, and voltage domains formed in accordance with voltage domain file 205. Connection declarations for hierarchy level 0 are defined as global in voltage definition file 205 and as a result, VDD and VSS rails for logic inferred within block 500 (see FIG. 3), or instantiated and not defined as a voltage domain by file 205, are connected to global sources in accordance with file 205.

The netlists previously generated for blocks 510, 520 and 530 (see FIG. 3) would be integrated into netlist 240, however, as each of these blocks has been generated as a voltage domain, or nested voltage domain in accordance with voltage domain definition file 205, their supply rails would not be merged with the top level "GLOBAL" supplies. Thus, netlist 240 is a technology-dependent version of high-level design file 200 (see FIG. 3) with hierarchical structure and limits as depicted for IC chip 100 of FIG. 1.

With synthesis complete, in step 245, noise modeling is performed. The noise-modeling tool uses netlist 240, voltage domain definition file 205, design constraint file 210 and a circuit level profile file 250 to generate an electrically simulatable netlist 255. Circuit level profile file 250, contains for each circuit class (or in some cases each circuit), a single cycle current switching profile which can be instantiated in the noise model as a current source, a noise/IR drop acceptance profile, and possibly, frequency domain noise generation and acceptance profiles. In addition, circuit level profile file 250 contains equations for estimating IC chip VDD and VSS rail parasitic resistance and capacitance as a function of synthesis-provided voltage domain statistics such as cell count.

The noise-modeling tool generalizes each voltage domain into a set of modeling parameters, which include the percentages of different types of circuits in each voltage domain and the physical size of the voltage domain. The modeling tool also infers probable physical relationships between domains based upon estimated domain physical sizes and relative connectivity or, as an alternative, the designer may provide a preliminary floorplan proposal to the modeling tool to override synthesis-generated domain sizes and specify relative locations within the IC design to be used in the simulatable model.

The noise-modeling tool combines information from circuit level profile file 250 and netlist 240 to form a mesh model of the IC device with current switching profiles representing current demand versus time for circuits or groups of circuits in each voltage domain and the electrical coupling between voltage domains. Operational frequency information and switching factor percentages provided by the designer for each voltage domain from design constraint file 210 are used to affect the current profiles for each simulation element in the mesh. In order to adjust the current profiles for frequency information, the bulk of the AC transient may be assumed to be close to the initial switch point of the element with leakage currents present at the end of the transient period extendable to the limits of the domain timing period. In order to adjust the current profile for switching factor information, the amplitude of the current pulse may be scaled to provide an average demand based on domain content and switching factor. Improved accuracy in predicting switching factors for analysis may be derived from switching factor simulators known in the art. To define the simulation period, the noise modeling tool selects a period equal to the period of the lowest-frequency voltage domain as defined in design constraints file 210 in order to contain the current profiles of elements within said domain. Current profiles or groups of current profiles representing voltage domains at higher operational frequencies may be repeated sequentially in the simulation to fill the simulation cycle. Start-of switch for each voltage domain within the simulation model defaults to simultaneous unless otherwise defined in design constraint file 210. Specification of a cycle offset within design constraints file 210 allows the current profile for any voltage domain to be shifted by a portion of the domain's cycle time, affecting superposition of current demand within IC chip 100 and simulatable netlist 255.

The noise-modeling tool uses information in circuit level profile file 250 to establish checking limits for each critical circuit (or circuits) within a voltage domain. These limits may be rail envelope minimums, VSS maximums, VDD minimums, overshoot, undershoot, AC current draw, DC current draw, etc. The noise-modeling tool also introduces designer-specified checks from design constraints file 210 into electrically simulatable netlist 255.

In step 260 a single cycle simulation is performed on electrically simulatable netlist 255 by the simulator, which may be a SPICE-like program (SPICE=simulation program for integrated circuits emphasis and was originally developed at the Electronics Research Laboratory of the University of California, Berkeley (1975) and now has many commercial variations.) The SPICE simulator calculates and plots nodal voltages and currents, AC and DC current demand and rail droop. In addition, SPICE or other simulators may be used to generate expected noise spectrums. Both AC and DC voltages and currents, and possibly noise frequency spectrums produced in simulation are tested against all checks built into the simulatable model 255.

Should there be fails, the simulator calls an analyzer which combs the data generated by the simulator, identifying nodes that fail checks for patterns and building a fail map. From the fail map, the analyzer proposes multiple alternative changes to the voltage domain for each failing voltage domain. The analyzer uses a costs file 265 in proposing alternatives. Costs file 265 defines an in-order list of preference/design cost/weighting/capabilities that the analyzer of step 260 uses to generate alternatives. It should be understood that the analyzer generates alternatives from the most current version of the electrically simulatable netlist and results may be viewed by the designer throughout the design process. These alternative changes may include but are not limited to addition of direct chip attach (DCA) noise suppression, insertion of on-chip decoupling capacitors, use of module level noise suppression and substitution of components declared in preferred components file 215 with more capable elements within synthesis library 235. Alternative changes may also include the creation of new voltage domains, the division of existing voltage domains into multiple voltage domains, addition of power supply resource for certain voltage domains, or greater physical separation between voltage domains.

In step 270, it is determined if the noise targets are met by the present IC design as described in netlist 240, synthesized in step 230, modeled in step 245 and simulated in step 260. If the noise targets are met, then the method proceeds to step 275, otherwise the method proceeds to step 280 of FIG. 7B via connector "A."

Referring to FIG. 7B, in step 280 the changes generated by the analyzer in step 260 of FIG. 7A are presented to and examined by the designer. In step 285, the designer can accept or reject each alternative proposed by the analyzer or terminate the design process. If in step 285, the designer rejects all proposed alternatives from the analyzer, then in step 286, the designer decides whether to modify design constraint file 210. If in step 286, the designer decides to modify design constraint file 210 then, in step 287, the designer modifies design constraint file 210 in order to alter designer-imposed noise constraints, reanalysis is performed (using the analysis tool of step 260) and the method proceeds to step 280. Otherwise, if the designer chooses not to modify design constraint file 210, the designer may decide in step 288 to modify costs file 265. If the designer decides in step 288 to modify cost file 265 then in step 295, the designer modifies costs file 265 otherwise the method loops back to step 280. Thus, the alternatives generated by the analyzer will change as costs file 265 is modified and new alternatives will be presented as the method loops back to step 280.

Returning to step 285, if the designer accepts at least one alternative proposed by the analyzer, then, in step 290, the proposed change(s) to the design of IC chip 100 (FIG. 1) are evaluated to determine if the changes are compatible with netlist 240, or require generation of a new high-level design file. If changes to the IC design are limited to the addition of instantiated components such as capacitors and connection pads to existing VDD and VSS rails, addition of physical design keywords to drive isolation construction or assignment of mandatory domain spacing or other physical design properties, update of the netlist is possible, and if the designer accepts, netlist 240 is updated to include the additional components and/or keywords and the method then returns to step 245 of FIG. 7A via connector "C". If the update involves creation of new voltage domains, division of existing voltage domains, other large scale changes, or the designer elects to generate a new high-level design regardless of netlist update capability a new version of the high-level design file is generated. A copy of the high-level design is saved and the high-level design updated. Possible updates to the high level design may include insertion of keywords for voltage domain division, instantiations of synthesizable constructs such as voltage regulation systems, capacitors, etc, as well as possible additions to drive physical design, at which time the method returns to step 230 of FIG. 7A via connector "B".

Returning to FIG. 7A, from connector B of step 290 of FIG. 7B, accepted alternatives implemented in the updated high-level design file are re-synthesized in step 230. Within step 230, synthesis progresses from the highest level of hierarchy to the lowest level of hierarchy as previously described, implementing synthesizable constructs and instantiations added in step 290 (FIG. 7B) into netlist 240. Keyword processing to divide existing voltage islands or replicate rail resources which may include chip level supply pins, headers and regulators occurs during synthesis of their target hierarchy and voltage domain. Division of existing voltage islands is accomplished in three phases. In a first phase, synthesis of logic within the domain is performed as previously described. In a second phase, separation of the synthesized logic into two or more partitions is performed. Partitions may be formed through division of circuit counts or in an attempt to separate noise-sensitive circuits, as defined by their circuit level profile, from the remainder of circuits within the original domain. In the third phase of separation processing, synthesis of VDD and VSS rails which includes addition of components and chip-level pads is performed in accordance with the updated high-level design file, voltage domain definition file 205, synthesis library 235 and optionally, preferred components file 215 on all voltage domain partitions. With synthesis of the updated high-level design file complete, the method proceeds again to noise modeling, step 245.

The method continues, as described, looping through steps 230, 245, 260 and 270 (including steps 280, 285, 286, 287, 288, 290 and 295 of FIG. 7B, as required) until a successful design point is found and in step 270 it is determined that the noise targets are met by the present IC design. When step 270 completes successfully, the method proceeds to step 275.

In step 275, the physical design tool generates a physical implementation of IC chip 100. The physical design tool used by the present invention includes modifications not present in conventional design tools. The design tool first parses physical design keywords from incoming netlist 240 and then implements within-voltage-domain, voltage-domain-to-voltage-domain and domain-to-voltage-supply relationships described by netlist 240. The physical design tool treats each non-global voltage domain as a separate voltage island, working from the highest level of hierarchy to the lowest level of hierarchy, to implement nesting(s) of physical voltage islands, which match the specification of netlist 240.

In step 300, the mesh model generated in step 245 is updated to reflect the dimensions and properties associated with global and voltage-island VDD and VSS rails produced in physical design step 275. The corresponding model accurately accounts for electrical properties such as resistance and capacitance and any pre-physical-design margins on circuit level profile specifications are removed.

In step 305, another simulation is performed using the same simulator as in step 260. The method then proceeds to step 310 of FIG. 7C via connector "D."

Referring to FIG. 7C, in step 310 it is determined if the noise targets are met by the present IC design as described in netlist 240. If the noise targets are met, then the method proceeds to step 315, otherwise the method proceeds to step 320. In step 315, the final IC design, which may include both an IC chip design and an IC package design, is complete and data files needed for device manufacturing as well as procurement of DCA and package-level components are generated. The method then terminates.

In step 320, the changes generated by the analyzer in step 305 of FIG. 7A are presented to, and examined by, the designer. In step 325, the designer can accept or reject each alternative proposed by the analyzer. If in step 325, the designer rejects all proposed alternatives from the analyzer, then, in step 326, the designer decides whether to modify design constraint file 210. If in step 326, the designer decides to modify design constraint file 210, then in step 327, the designer modifies design constraint file 210 in order to alter designer-imposed noise constraints, re-analysis is performed (using the analysis tool of step 260), and the method proceeds to step 320. Otherwise, if the designer chooses not to modify design constraint file 210, the designer may decide in step 328 to modify costs file 265. If the designer decides in step 328 to modify cost file 265 then, in step 335, the designer modifies costs file 265. Otherwise the method returns back to step 320. Thus, the alternatives generated by the analyzer will change as costs file 265 is modified and new alternatives will be presented as the method loops back to step 320.

If, in step 325, the designer accepts at least one alternative proposed by the analyzer, then, in step 320, the proposed change(s) to the design of the IC are evaluated to determine if the changes are compatible with netlist 240, or require generation of a new high-level design file. If changes to the IC design are limited to the addition of instantiated components such as capacitors and connection pads to existing VDD and VSS rails, addition of physical design keywords to drive isolation construction, or assignment of mandatory domain spacing or other physical design properties, update of the netlist is possible, and if the designer accepts, netlist 240 is updated to include the additional components and/or keywords. The method then returns to step 275 of FIG. 7A via connector "E".

Returning to step 275 of FIG. 7A from connector "E" of FIG. 7C, the physical design of the IC chip is regenerated incorporating design alternatives accepted in step 325 of FIG. 7C and the updated physical design is subsequently verified by looping through steps 300 and 305 of FIG. 7A and steps 310, 315, 320, 325, 326, 327, 328 330 and 335 of FIG. 7C as required.

Returning to step 330 of FIG. 7C, if the accepted updates involve creation of new voltage domains, division of existing voltage domains, other large-scale changes or the designer elects to generate a new high-level design regardless of netlist update capability, then, in step 330, a new version of the high-level design file is generated. The current high-level design file is copied and then updated by inserting keywords for voltage domain division, instantiations of synthesizable constructs such as voltage regulation systems, capacitors, etc, as well as possible additions to drive physical design, at which time the method returns to step 230 of FIG. 7A via connector "B".

Returning to step 230 of FIG. 7A from connector "B" of FIG. 7C, the method continues through at minimum steps 245, 260, 275, 300, 305, 310 and 315 with possible additional loops through steps 280, 285, 286, 287, 290, 295, 320, 325, 326, 327, 328 335 and 330 until IC chip design is complete and verified.

Figure 8:
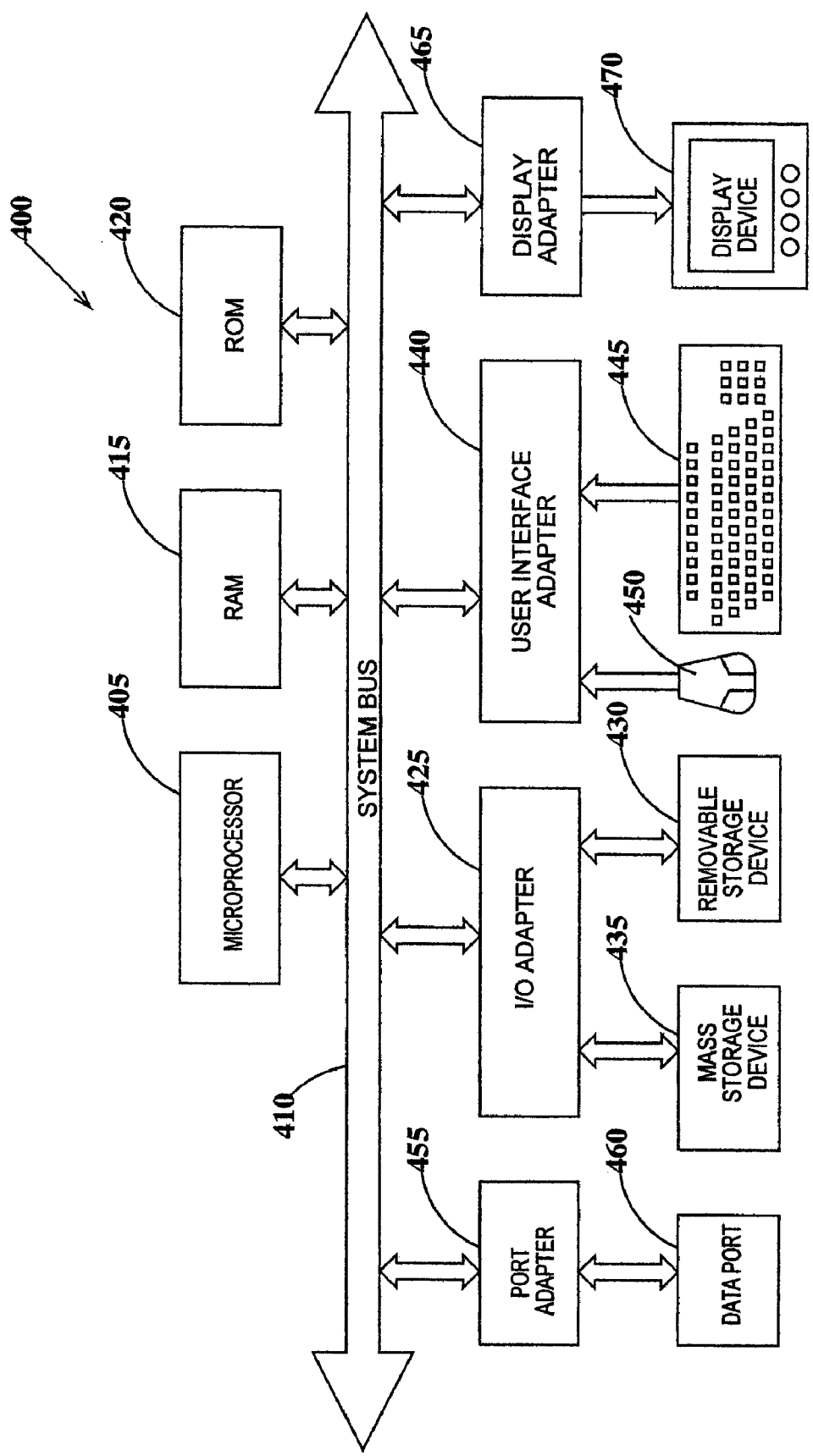
FIG. 8 is a schematic block diagram of a general-purpose computer for practicing the present invention.

Generally, the method described herein with respect to a method for designing an IC having power distribution partitions is practiced with a general-purpose computer and the method may be coded as a set of instructions on removable or hard media for use by the general-purpose computer. FIG. 8 is a schematic block diagram of a general-purpose computer for practicing the present invention. In FIG. 8, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, the need for an automated design system for designing an IC having multiple power domains is satisfied by the present invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A method for designing an integrated circuit having multiple voltage domains, comprising:
    (a) generating a logical integrated circuit design from information contained in a high-level design file, said high-level design file defining global connection declarations and voltage domain connection declarations;
    (b) synthesizing said logical integrated circuit design into a synthesized integrated circuit design based upon said logical integrated circuit design, information in a voltage domain definition file and a design constraint file;
    (c) generating a noise model from said synthesized integrated circuit design based on information in said voltage domain definition file, a circuit level profile and a design constraint file; and
    (d) simulating said noise model against constraints in said design constraint file and constraints in a circuit level profile file to determine if said synthesized integrated circuit design meets predetermined noise targets.

2. The method of claim 1, wherein said voltage domain definition file contains attributes of each global connection declaration and each voltage domain connection declaration defined in said high-level design file.

3. The method of claim 2, wherein said attributes of said global domain connection declarations and attributes of said voltage domain connection declarations are each independently selected from the group of attributes consisting of global attributes, voltage island attributes, flatten level attributes, off chip supply attributes, supply header attributes, controlled from attributes, ground noise isolated attributes, VSS rail value attributes, VDD rail attributes, internal power bus tag attributes and noise suppression required attributes.

4. The method of claim 1, further comprising providing a preferred components file containing a library of components selected from a group of components consisting of power supply elements such as regulators, voltage translators, on-chip capacitors, direct-chip-attach noise filters, on-package components such as resistors, capacitors, inductors, ferrites, voltage regulators, and combinations thereof.

5. The method of claim 1, wherein said design constraint file comprises for each global domain and for each voltage domain, specifications independently selected from the group consisting of power rail noise specifications, ground noise specifications, power bus droop specifications, ground bus droop specifications, operating frequency specifications, voltage domain switching factor specifications and a clock cycle offset factor specifications.

6. The method of claim 1, wherein said circuit level profile file includes for each circuit or each circuit class, a single cycle current switching profile which can be instantiated in the noise model as a current source, an AC noise generation and acceptance profile, and a parasitic component estimate.

7. The method of claim 1, further including:
(e) analyzing results of said simulation of said noise model to determine if any voltage domain fails; and
(f) for each failing voltage domain, proposing one or more alternative changes in said synthesized integrated circuit design.

8. The method of claim 7, further including:
(g) selecting one or more of said one or more alternative changes and repeating steps (a) through (f) one or more times.

9. The method of claim 1, further including:
(h) performing a physical design from said synthesized integrated circuit design.

10. The method of claim 9, wherein step (h) includes:
removing placement attributes of said synthesized integrated circuit design; and
implementing within voltage domain, voltage domain to voltage domain and voltage domain to voltage supply relationships described in the synthesized integrated circuit design.

11. A computer system comprising a processor, an address/data bus coupled to said processor, and a computer-readable memory unit adapted to be coupled to said processor, said memory unit containing instructions that when executed by said processor implement a method for designing an integrated circuit having multiple voltage domains, said method comprising the computer implemented steps of:
(a) generating a logical integrated circuit design from information contained in a high-level design file, said high-level design file defining global connection declarations and voltage domain connection declarations;
(b) synthesizing said logical integrated circuit design into a synthesized integrated circuit design based upon said logical integrated circuit design, information in a voltage domain definition file and a design constraint file;
(c) generating a noise model from said synthesized integrated circuit design based on information in said voltage domain definition file, a circuit level profile file and optionally and a design constraint file; and
(d) simulating said noise model against constraints in said design constraint file and constraints in a circuit level profile file to determine if said synthesized integrated circuit design meets predetermined noise targets.

12. The system of claim 11, wherein said voltage domain definition file contains attributes of each global connection declaration and each voltage domain connection declaration defined in said high-level design file.

13. The system of claim 12, wherein said attributes of said global domain connection declarations and attributes of said voltage domain connection declarations are each independently selected from the group of attributes consisting of global attributes, voltage island attributes, flatten level attributes, off chip supply attributes, supply header attributes, controlled from attributes, ground noise isolated attributes, VSS rail value attributes, VDD rail attributes, internal power bus tag attributes and noise suppression required attributes.

14. The method of claim 11, further comprising providing a preferred components file containing a library of components selected from a group of components consisting of power supply elements such as regulators, voltage translators, on-chip capacitors, direct-chip-attach noise filters, on-package components such as resistors, capacitors, inductors, ferrites, voltage regulators, and combinations thereof.

15. The system of claim 11, wherein said design constraint file comprises for each global domain and for each voltage domain, specifications independently selected from a group consisting of power rail noise specifications, ground noise specifications, power bus droop specifications, ground bus droop specifications, operating frequency specification, voltage domain switching factor specifications and a clock cycle offset factor specifications.

16. The system of claim 11, wherein said circuit level profile file includes for each circuit or each circuit class, a single cycle current switching profile which can be instantiated in the noise model as a current source, an AC noise generation and acceptance profile, and a parasitic component estimate.

17. The system of claim 11, further including the method steps of:
(e) analyzing results of said simulation of said noise model to determine if any voltage domain fails; and
(f) proposing one or more alternative changes to said synthesized integrated circuit design for each failing voltage domain.

18. The system of claim 17, further including the method steps of:
(g) selecting one or more of said one or more alternative changes and repeating steps (a) through (f) one or more times.

19. The system of claim 11, further including the method steps of:
(h) performing a physical design from said synthesized integrated circuit design.

20. The system of claim 19, wherein method step (h) includes:
(h) removing placement attributes of said synthesized integrated circuit design; and
implementing within voltage domain, voltage domain to voltage domain and voltage domain to voltage supply relationships described in the synthesized integrated circuit design.

* * * * *